(12) United States Patent
Hase

(10) Patent No.: US 11,309,849 B2
(45) Date of Patent: Apr. 19, 2022

(54) POWER AMPLIFIER CIRCUIT

(71) Applicant: Murata Manufacturing Co., Ltd., Kyoto (JP)

(72) Inventor: Masatoshi Hase, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 16/935,514

(22) Filed: Jul. 22, 2020

(65) Prior Publication Data
US 2020/0350874 A1 Nov. 5, 2020

Related U.S. Application Data

(63) Continuation of application No. PCT/JP2019/001687, filed on Jan. 21, 2019.

(30) Foreign Application Priority Data

Jan. 23, 2018 (JP) .............................. JP2018-008659

(51) Int. Cl.
*H03F 1/32* (2006.01)
*H03F 3/24* (2006.01)

(52) U.S. Cl.
CPC ........... *H03F 1/3241* (2013.01); *H03F 3/245* (2013.01); *H03F 2200/171* (2013.01); *H03F 2200/451* (2013.01)

(58) Field of Classification Search
CPC ................................ H03F 1/3241; H03F 1/26
USPC ........................................ 330/149, 310, 302
See application file for complete search history.

(56) References Cited

U.S. PATENT DOCUMENTS

| 4,992,754 A | * | 2/1991 | Blauvelt | ............... | H03F 1/3252 |
| | | | | | 327/100 |
| 6,437,644 B1 | * | 8/2002 | Kenington | ............ | H03F 1/3247 |
| | | | | | 330/136 |
| 6,734,732 B2 | * | 5/2004 | Cavers | .................. | H03F 1/3229 |
| | | | | | 330/149 |

(Continued)

FOREIGN PATENT DOCUMENTS

| JP | H04288711 A | 10/1992 |
| JP | 2001244752 A | 9/2001 |

(Continued)

OTHER PUBLICATIONS

International Search Report for International Application No. PCT/JP2019/001687, dated Mar. 19, 2019.

(Continued)

*Primary Examiner* — Henry Choe
(74) *Attorney, Agent, or Firm* — Pearne & Gordon LLP

(57) ABSTRACT

Provided is a power amplifier circuit that can increase output power and also reduce the effect of intermodulation distortion. The power amplifier circuit includes a power divider, a distortion compensation circuit provided on the secondary path, a power combiner, and a first amplifier configured. The distortion compensation circuit includes a generation circuit configured to generate the second-harmonic wave of the input signal, a filter circuit configured to attenuate the fundamental wave and pass the second-harmonic wave, and a phase adjustment circuit configured to adjust the phase of the second-harmonic wave.

11 Claims, 8 Drawing Sheets

(56) References Cited

U.S. PATENT DOCUMENTS

| | | | |
|---|---|---|---|
| 7,307,473 B2* | 12/2007 | Kusunoki | H03F 1/3223 |
| | | | 330/149 |
| 2005/0242877 A1 | 11/2005 | Kusunoki et al. | |
| 2008/0058001 A1 | 3/2008 | Kusunoki | |

FOREIGN PATENT DOCUMENTS

| | | | |
|---|---|---|---|
| JP | 2005318373 A | 11/2005 | |
| JP | 2008061123 A | 3/2008 | |
| JP | 2008219453 A | 9/2008 | |
| JP | 2010183525 A | 8/2010 | |
| WO | 2005027340 A1 | 3/2005 | |

OTHER PUBLICATIONS

Written Opinion for International Application No. PCT/JP2019/001687, dated Mar. 19, 2019.

* cited by examiner

POWER AMPLIFIER CIRCUIT

This is a continuation of International Application No. PCT/JP2019/001687 filed on Jan. 21, 2019 which claims priority from Japanese Patent Application No. 2018-008659 filed on Jan. 23, 2018. The contents of these applications are incorporated herein by reference in their entireties.

BACKGROUND

Technical Field

The present disclosure relates to a power amplifier circuit.

Mobile communication devices, such as mobile phones include power amplifiers for amplifying electric power of transmit signals. In the case in which, for example, a plurality of signals with adjacent frequencies are inputted to the power amplifier, these signals may cause intermodulation distortion (IMD) and gain linearity may become worse. In this regard, with the aim of reducing the effect of such intermodulation distortion, a technology of deliberately adding a harmonic wave in a signal path to cancel out intermodulation distortion components has been developed. For example, Patent Document 1 discloses a distortion compensating and power amplifying apparatus in which the output of an amplifier of a first stage is split into a fundamental wave and a second-harmonic wave, the second-harmonic wave is changed in phase and amplitude, the second-harmonic wave is then combined with the fundamental wave, and the resultant wave is inputted to another amplifier of a subsequent stage, so that compensation for intermodulation distortion is achieved.

Patent Document 1: U.S. Patent Application Publication No. 2005/0242877

BRIEF SUMMARY

In recent years, due to the introduction of new communication standards, such as the fourth-generation (4G) mobile communication system and the fifth-generation (5G) mobile communication system, the number of frequency bands that power amplifier circuits need to support has increased, and thus, the number of filter circuits has also increased. Since this increases insertion loss at the front-end, for the purpose of compensating for the loss, demand for increased output power of transmit signals transmitted by mobile phones has risen. Thus, as described above, in the case in which a harmonic wave is deliberately added for the purpose of compensating for intermodulation distortion, as output power of transmit signals are increased, power of the added harmonic wave needs to be increased. However, since in the apparatus disclosed in Patent Document 1 the second-harmonic wave occurring at the amplifier of the first stage is added, power of the second-harmonic wave may be insufficient for power of transmit signals.

The present disclosure provides a power amplifier circuit that can increase output power and also reduce the effect of intermodulation distortion.

A power amplifier circuit according to an aspect of the present disclosure includes a power divider configured to divide an input signal and output the divided input signal to a primary path and a secondary path, a distortion compensation circuit provided on the secondary path, a power combiner configured to combine a fundamental wave of the input signal having traveled along the primary path with a second-harmonic wave of the input signal having traveled along the secondary path, and a first amplifier configured to amplify a combined signal outputted from the power combiner and output an amplified signal. The distortion compensation circuit includes a generation circuit configured to generate the second-harmonic wave of the input signal, a filter circuit configured to attenuate the fundamental wave and pass the second-harmonic wave, and a phase adjustment circuit configured to adjust the phase of the second-harmonic wave.

The present disclosure can provide a power amplifier circuit that can increase output power and also reduce the effect of intermodulation distortion.

DETAILED DESCRIPTION

Figure 1:
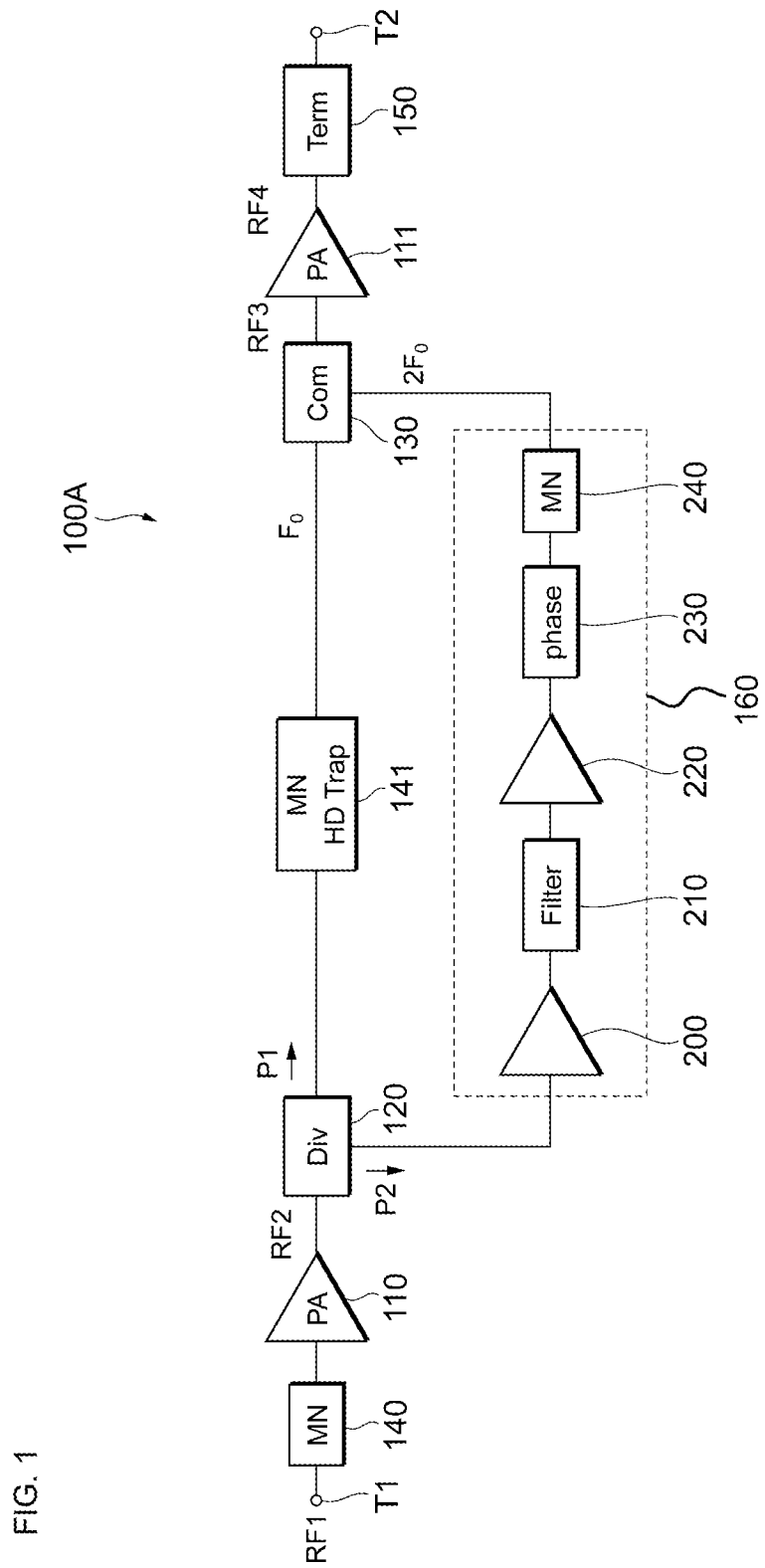
FIG. 1 is a diagram illustrating a configuration example of a power amplifier circuit according to a first embodiment of the present disclosure.

Hereinafter, embodiments of the present disclosure are described in detail with reference to the drawings. It should be noted that the same elements are assigned the same reference characters and redundant descriptions are omitted.

FIG. 1 is a diagram illustrating a configuration example of a power amplifier circuit according to a first embodiment of the present disclosure. A power amplifier circuit 100A illustrated in FIG. 1 is provided in, for example, a mobile communication device, such as a mobile phone and used for amplifying electric power of radio frequency (RF) signals to be transmitted to base stations. The power amplifier circuit 100A amplifies power of signals of communication standards, such as the second-generation (2G) mobile communication system, the third-generation (3G) mobile communication system, the 4G mobile communication, the 5G mobile communication system, Long-Term Evolution Frequency-Division Duplex (LTE-FDD), Long-Term Evolution Time-Division Duplex (LTE-TDD), LTE-Advanced, and LTE-Advanced Pro. The frequency of RF signals ranges, for example, from about several hundreds of MHz to about several tens of GHz. The communication standard and the frequency of signals amplified by the power amplifier circuit 100A are not limited to these examples.

The power amplifier circuit 100A includes, for example, amplifiers 110 and 111, a power divider 120, a power combiner 130, matching circuits 140 and 141, a harmonic termination circuit 150, a distortion compensation circuit 160, an input terminal T1, and an output terminal T2. The power amplifier circuit 100A also includes a primary path P1 and a secondary path P2.

The amplifier 110 (a third amplifier) and the amplifier 111 (a first amplifier) both amplify inputted RF signals and output the RF signals. This means that the power amplifier circuit 100A amplifies electric power in two stages. Specifically, the amplifier 110 of a first stage (a drive stage) amplifies an RF signal RF1 inputted from the input terminal T1 via the matching circuit 140 and outputs an RF signal RF2 (an input signal). The amplifier 111 of a posterior stage (a power stage) amplifies an RF signal RF3 (a combined signal) resulting from combination by the power combiner 130 described later and outputs an RF signal RF4. The RF signals RF2 and RF4, each includes a harmonic wave including the second-harmonic wave generated by amplification of the amplifier 110 or 111. The amplifiers 110 and 111 are both configured by using bipolar transistors, such as heterojunction bipolar transistors (HBTs). The amplifiers 110 and 111 may be configured by using field effect transistors (MOSFETs: Metal-oxide-semiconductor Field-Effect Transistors) instead of HBTs.

The power divider 120 divides the RF signal RF2 (the input signal) outputted by the amplifier 110 of the first stage and outputs the divided RF signal RF2 to the primary path P1 and the secondary path P2. The primary path P1 is a path starting from the input terminal T1 and leading to the output terminal T2 via the matching circuit 141. The primary path P1 is a path along which a fundamental wave $F_0$ of the RF signal RF1 travels. The secondary path P2 is a path starting from the power divider 120 and leading to the power combiner 130 via the distortion compensation circuit 160. The secondary path P2 is a path for generating a second-harmonic wave $2F_0$ to compensate for third-order intermodulation distortion caused at the amplifier 111 of the posterior stage. The power divider 120 is not limited to an element, such as a coupler but only need to be configured to divide RF signals. For example, the power divider 120 may be a branch point at which the signal path is separated into the primary path P1 and the secondary path P2.

The power combiner 130 generates the RF signal RF3 (the combined signal) by combining the fundamental wave $F_0$ having traveled along the primary path P1 and the second-harmonic wave $2F_0$ having traveled along the secondary path P2 with each other. The generated RF signal RF3 is outputted to the amplifier 111 of the posterior stage.

The matching circuit 140 (MN: Matching Network) performs impedance matching between a circuit (not illustrated in the drawing) provided in an anterior stage and the amplifier 110.

The matching circuit 141 is provided between the power divider 120 and the power combiner 130 on the primary path P1 and performs impedance matching between the amplifiers 110 and 111. The matching circuit 141 also has a function of attenuating harmonic distortion (HD) caused by amplification of the amplifier 110. This means that the matching circuit 141 is configured as a specific example of a second-harmonic-wave attenuation circuit. This configuration hinders output of the second-harmonic wave to the power combiner 130 through the primary path P1. Specifically, the matching circuit 141 may be, for example, a low-pass-filter (LPF) circuit having a frequency characteristic of passing the fundamental wave and attenuating the second-harmonic wave.

The harmonic termination circuit 150 is provided in a subsequent stage after the amplifier 111. The harmonic termination circuit 150 grounds, for example, the second-harmonic wave included in the RF signal RF4. As a result, the output terminal T2 outputs a transmit signal in which the second-harmonic wave has been attenuated. The harmonic termination circuit 150 may have a function of impedance matching between the amplifier 111 and a circuit in a posterior stage after the output terminal T2.

The distortion compensation circuit 160 is provided between the power divider 120 and the power combiner 130 on the secondary path P2. The distortion compensation circuit 160 is a circuit configured to generate the second-harmonic wave $2F_0$, which is deliberately added to compensate for third-order intermodulation distortion, and amplifies and outputs the second-harmonic wave $2F_0$. Specifically, the distortion compensation circuit 160 includes, for example, a harmonic-wave generation circuit 200, a filter circuit 210, an amplifier 220, a phase adjustment circuit 230, and a matching circuit 240.

The harmonic-wave generation circuit 200 generates the second-harmonic wave $2F_0$ of the RF signal RF2 from the RF signal RF2 outputted to the secondary path P2 by the power divider 120. The harmonic-wave generation circuit 200 may be formed as, for example, an amplifier that amplifies the RF signal RF2. Alternatively, the harmonic-wave generation circuit 200 may be formed as a multiplier circuit that doubles the frequency of the fundamental wave $F_0$ inputted from the power divider 120 to the secondary path P2.

The filter circuit 210 is provided in, for example, a subsequent stage after the harmonic-wave generation circuit 200. The filter circuit 210 has a frequency characteristic of attenuating the fundamental wave $F_0$ and passing the second-harmonic wave $2F_0$. With this configuration, in the case in which the harmonic-wave generation circuit 200 of the anterior stage is formed as, for example, the amplifier, only the second-harmonic wave $2F_0$, which is to be used for compensation for distortion, is extracted from the signal outputted from the amplifier. The filter circuit 210 may be configured as, for example, a high-pass-filter (HPF) circuit or a band-pass-filter (BPF) circuit that attenuates the fundamental wave $F_0$ and passes the second-harmonic wave $2F_0$.

The amplifier 220 (a second amplifier) is provided in, for example, a subsequent stage after the filter circuit 210. The amplifier 220 amplifies the amplitude of the second-harmonic wave $2F_0$ inputted via the filter circuit 210 and outputs the second-harmonic wave $2F_0$ to the phase adjustment circuit 230. Since the distortion compensation circuit 160 includes the amplifier 220, when the level of output power of the transmit signal is relatively high, the power of the second-harmonic wave $2F_0$ can be also increased in accordance with the level. In the case in which the output level of the harmonic-wave generation circuit 200 satisfies a level required for the second-harmonic wave $2F_0$, the amplifier 220 is not necessarily included in the distortion compensation circuit 160.

The phase adjustment circuit 230 is provided in, for example, a subsequent stage after the amplifier 220. The phase adjustment circuit 230 performs adjustment to render the phase of the generated second-harmonic wave $2F_0$ suitable for distortion compensation and outputs the second-harmonic wave $2F_0$.

The matching circuit 240 performs impedance matching between the phase adjustment circuit 230 and the amplifier 111.

With the configuration described above, the distortion compensation circuit 160 can generate the second-harmonic wave $2F_0$ that is to be deliberately added to the input of the amplifier 111. The order in which the components included in the distortion compensation circuit 160 are arranged is not limited to this example and may be changed as appropriate. For example, the amplifier 220 may be provided in a subsequent stage after the phase adjustment circuit 230. Furthermore, the power divider 120, the power combiner 130, the matching circuits 140, 141, and 240, the harmonic termination circuit 150, the filter circuit 210, and the phase adjustment circuit 230 may be each configured to include elements, such as an inductor and a capacitor, or a resonator using acoustic waves, such as a surface-acoustic-wave (SAW) filter.

Figure 2:
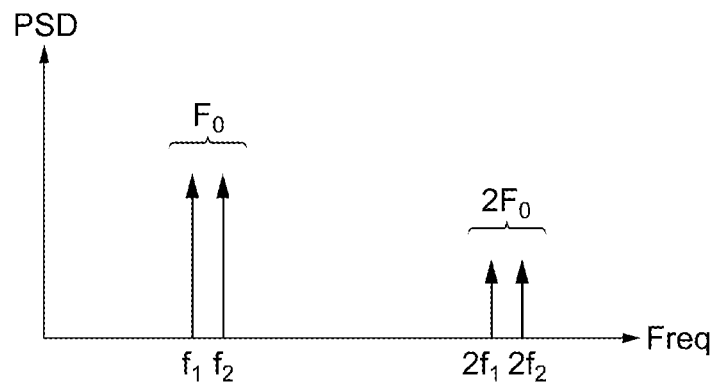
FIG. 2 is a diagram illustrating the spectrum of a signal inputted to an amplifier 111 of a posterior stage.
Figure 3:
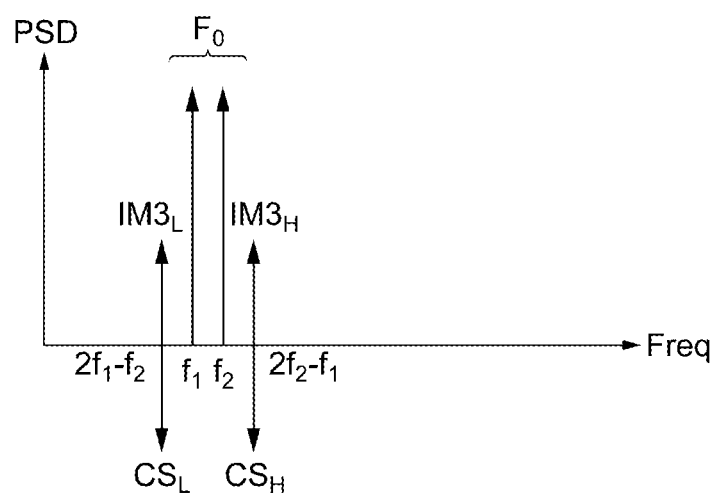
FIG. 3 is a diagram illustrating part of the spectrum of a signal outputted from the amplifier 111 of the posterior stage.

Next, with reference to FIGS. 2 and 3, effects of compensation for third-order intermodulation distortion are described. FIG. 2 is a diagram illustrating the spectrum of a signal, which is the RF signal RF3 in FIG. 1, inputted to the amplifier 111 of the posterior stage. FIG. 3 is a diagram illustrating part of the spectrum of a signal, which is the RF signal RF4 in FIG. 1, outputted from the amplifier 111 of the posterior stage. In graphs illustrated in FIGS. 2 and 3, the horizontal axes indicate the frequency of the signal and the vertical axes indicate the power spectral density (PSD).

As indicated in FIG. 2, the fundamental wave $F_0$ having traveled along the primary path P1 and the second-harmonic wave $2F_0$ having traveled along the secondary path P2 are inputted to the amplifier 111 of the posterior stage. Here, the fundamental wave $F_0$ contains components of two kinds of frequencies $f_1$ and $f_2$ ($f_1<f_2$) adjacent to each other. In this case, the second-harmonic wave of each of the two kinds of frequencies $f_1$ and $f_2$ is generated in the secondary path P2, and thus, the second-harmonic wave $2F_0$ contains components of two kinds of frequencies $2f_1$ and $2f_2$. As such, signals at the frequencies $f_1$ and $f_2$ and signals at the frequencies $2f_1$ and $2f_2$ are inputted together to the amplifier 111.

Subsequently, as the effect of amplification of the amplifier 111, an amplified signal obtained by amplifying the fundamental wave $F_0$ is outputted as indicated in FIG. 3. Additionally, as the effect of amplification of the amplifier 111, third-order intermodulation distortion $IM3_L$ with a frequency $2f_1$-$f_2$ occurs on a low-frequency side with respect to the fundamental wave $F_0$ while third-order intermodulation distortion $IM3_H$ with a frequency $2f_2$-$f_1$ occurs on a high-frequency side with respect to the fundamental wave $F_0$. The third-order intermodulation distortions $IM3_L$ and $IM3_H$ are relatively close to the frequencies $f_1$ and $f_2$ of the fundamental wave $F_0$, and hence, it is difficult to remove the third-order intermodulation distortions $IM3_L$ and $IM3_H$ by using a filter circuit or the like. The third-order intermodulation distortions $IM3_L$ and $IM3_H$ can be, therefore, a cause of deterioration of linearity of the amplifier. The amplification of the amplifier 111 also causes, for example, other kinds of distortion, such as third-order intermodulation distortions with frequencies $2f_1$+$f_2$ and $2f_2$+$f_1$, but the frequencies of the distortions are relatively far from the frequencies $f_1$ and $f_2$ of the fundamental wave $F_0$ and descriptions thereof is thus omitted here.

For the purpose of compensating for the third-order intermodulation distortions $IM3_L$ and $IM3_H$, which is relatively close to the fundamental wave $F_0$, compensation signals $CS_L$ and $CS_H$ that cancel out the third-order intermodulation distortions $IM3_L$ and $IM3_H$ are generated by deliberately adding the second-harmonic wave $2F_0$ in this embodiment. Specifically, a signal obtained by adding the fundamental wave $F_0$ and the second-harmonic wave $2F_0$ in the power combiner 130 is inputted to the amplifier 111, and as a result, the compensation signal $CS_L$ with a frequency ($2f_1$-$f_2$), which is a difference between the frequency $2f_1$ as one frequency of the second-harmonic wave $2F_0$ and the frequency $f_2$ as the other frequency of the fundamental wave $F_0$, is generated. Additionally, a compensation signal $CS_H$ with a frequency ($2f_2$-$f_1$), which is a difference between the frequency $2f_2$ as the other frequency of the second-harmonic wave $2F_0$ and the frequency $f_1$ as one frequency of the fundamental wave $F_0$, is generated. These compensation signals $CS_L$ and $CS_H$ are respectively identical in frequency to the third-order intermodulation distortions $IM3_L$ and $IM3_H$. Furthermore, the phase adjustment circuit 230 changes the phase of the second-harmonic wave $2F_0$ in such a manner that the compensation signals $CS_L$ and $CS_H$ are almost opposite in phase to the third-order intermodulation distortions $IM3_L$ and $IM3_H$ at the output of the amplifier 111. Moreover, the amplifier 220 amplifies the amplitude of the second-harmonic wave $2F_0$ in such a manner that the compensation signals $CS_L$ and $CS_H$ and the third-order intermodulation distortions $IM3_L$ and $IM3_H$ cancel each other out at the output of the amplifier 111 with respect to amplitude. As such, as illustrated in FIG. 3, the compensation signals $CS_L$ and $CS_H$ cancel out the third-order intermodulation distortions $IM3_L$ and $IM3_H$. In FIG. 3, the compensation signals $CS_L$ and $CS_H$ are drawn in a downward direction to indicate that the compensation signals $CS_L$ and $CS_H$ are almost opposite in phase to the third-order intermodulation distortions $IM3_L$ and $IM3_H$.

Due to the effect described above, in the power amplifier circuit 100A, it is possible to reduce the effect of the third-order intermodulation distortions $IM3_L$ and $IM3_H$ occurring in the amplifier 111. As a result, the power amplifier circuit 100A can hinder the deterioration of linearity.

The configuration disclosed in Patent Document 1 does not include a circuit between a power divider and a power combiner on a primary path to attenuate the second-harmonic wave, and thus, the second-harmonic wave caused by amplification of the amplifier in the first stage passes through the primary path. As a result, in the case in which the second-harmonic wave is generated in a secondary path, the second-harmonic wave having traveled through the primary path and the second-harmonic wave having traveled through the secondary path may cancel each other out when the two kinds of second-harmonic waves are added together at the power combiner. Consequently, the power of the second-harmonic wave additionally inputted to the amplifier 111 may be insufficient. In this regard, in the present embodiment, the function of attenuating the second-harmonic wave is imparted to the matching circuit 141 provided in the primary path P1. With this configuration, in the present embodiment, a high-power second-harmonic wave can be inputted to the amplifier 111 in comparison to the configuration disclosed in Patent Document 1. Therefore, the power amplifier circuit 100A can increase output power and also reduce the effect of intermodulation distortion.

Furthermore, in the present embodiment, the distortion compensation circuit 160 includes the harmonic-wave generation circuit 200 for generating the second-harmonic wave. In the case in which the harmonic-wave generation circuit 200 is configured as an amplifier, the amplifier can be designed especially for generation of the second-harmonic wave. Thus, in comparison to the configuration disclosed in Patent Document 1 in which the amplifier of the first stage amplifies the fundamental wave and also generates the second-harmonic wave, it is possible to generate a high-power second-harmonic wave. Moreover, in the present embodiment, the distortion compensation circuit 160 includes the amplifier 220 that further amplifies the amplitude of the generated second-harmonic wave. Also with this configuration, the power amplifier circuit 100A can generate a high-power second-harmonic wave in comparison to the configuration disclosed in Patent Document 1, and as a result, it is possible to increase output power and also reduce the effect of intermodulation distortion.

All the components included in the power amplifier circuit 100A illustrated in FIG. 1 are not necessarily provided as individual circuits and one circuit may have a plurality of functions. For example, it is possible that the distortion compensation circuit 160 does not include the filter circuit 210, but instead, the phase adjustment circuit 230 has a function of the filter circuit 210.

While in the embodiment described above the case in which the distortion compensation circuit 160 generates the second-harmonic wave to compensation for third-order intermodulation distortion is described as an example, it is possible to compensate for higher-order intermodulation distortion. Usually, when the amplifier 111 amplifies a signal with the frequencies $f_1$ and $f_2$, (2N+1)-order intermodulation distortion with frequencies $\{(N+1)f_1-Nf_2\}$ and $\{(N+1)f_2-Nf_1\}$ (N is an integer equal to or greater than 1) is generated. As such, the distortion compensation circuit 160 can generate harmonic waves at integer multiples of a fundamental frequency, so that it is possible to cancel out intermodulation distortion of these high orders.

Figure 4A:
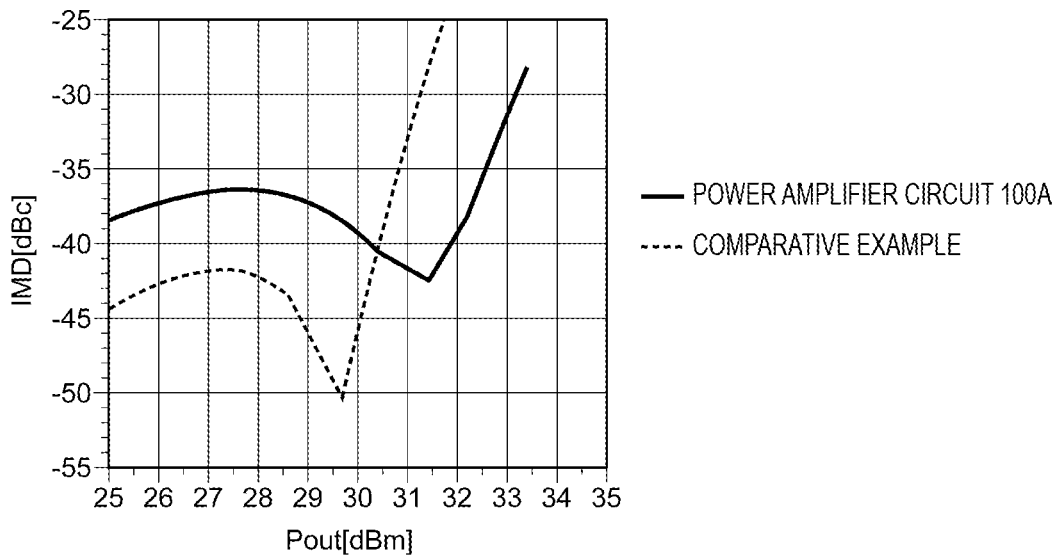
FIG. 4A is a graph indicating simulation results of third-order intermodulation distortion in the power amplifier circuit according to the first embodiment of the present disclosure and a comparative example.
Figure 4B:
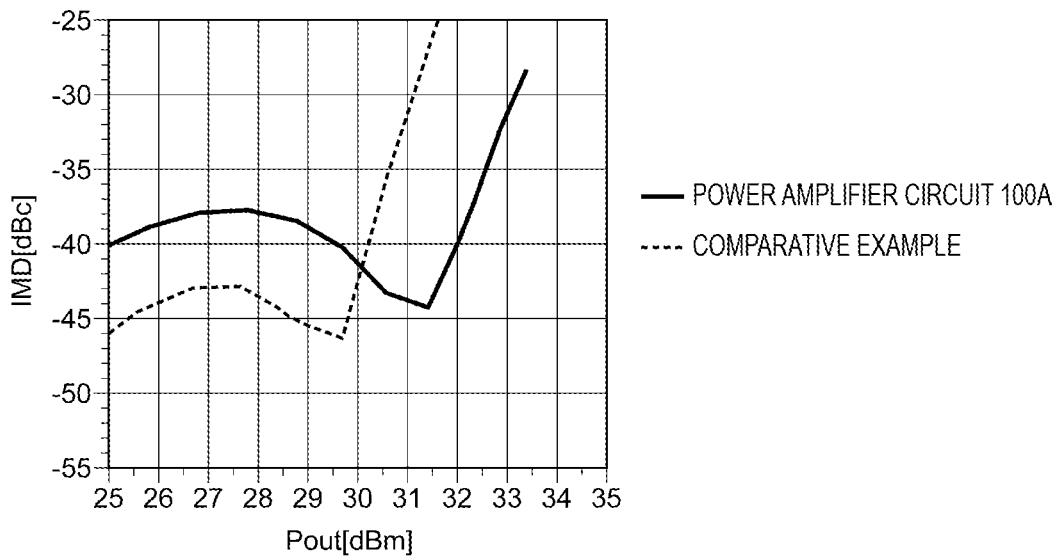
FIG. 4B is a graph indicating simulation results of third-order intermodulation distortion in the power amplifier circuit according to the first embodiment of the present disclosure and the comparative example.

FIGS. 4A and 4B are graphs indicating simulation results of third-order intermodulation distortion in the power amplifier circuit according to the first embodiment of the present disclosure and a comparative example. Here, the comparative example has a configuration formed by excluding the distortion compensation circuit 160 from the power amplifier circuit 100A illustrated in FIG. 1. FIG. 4A illustrates third-order intermodulation distortion on a low-frequency side with respect to the fundamental wave and FIG. 4B illustrates third-order intermodulation distortion on a high-frequency side with respect to the fundamental wave. In the graphs presented in FIGS. 4A and 4B, the horizontal axes indicate the output power Pout (dBm) of transmit signal and the vertical axes indicate the output level (dBc) of third-order intermodulation distortion with respect to the fundamental wave.

As illustrated in FIGS. 4A and 4B, both in the present embodiment and the comparative example, the output level of third-order intermodulation distortion steeply rises after the output level exceeds a particular output power level. However, for example, in the case of comparison of output power when distortion is −35 dBc, referring to FIG. 4A, the output power of the comparative example is approximately 31 dBm while the output power of the present embodiment is approximately 32.5 dBm, which indicates that the output power of the present embodiment is improved by approximately 1.5 dB as compared to the comparative example. Furthermore, referring to FIG. 4B, the output power of the comparative example is approximately 30.5 dBm while the output power of the present embodiment is approximately 32.5 dBm, which indicates that the output power of the present embodiment is improved by approximately 2.0 dB as compared to the comparative example. According to these results, it is understood that the present embodiment increases output power and also reduces the effect of intermodulation distortion.

Figure 5:
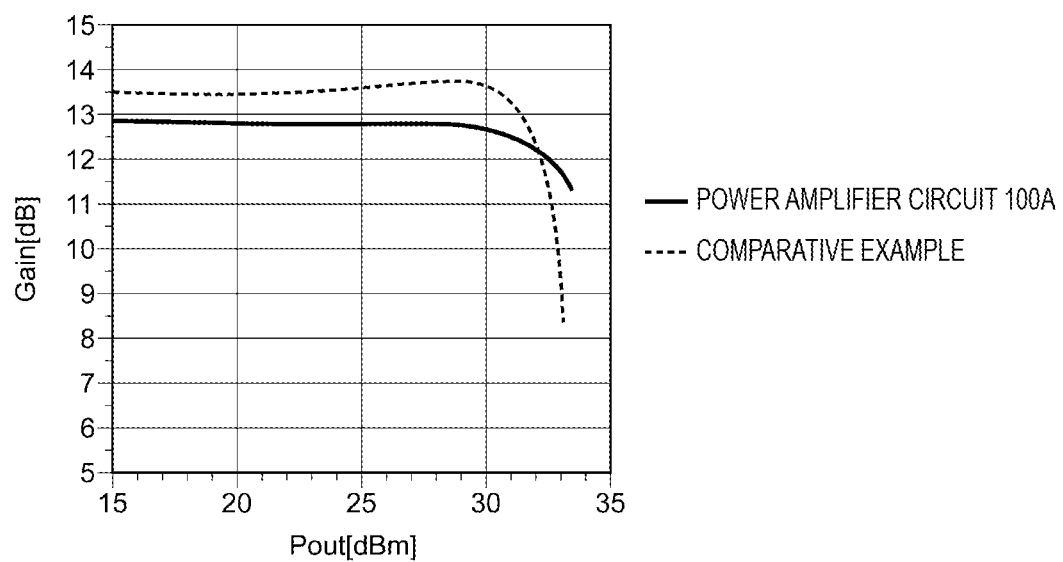
FIG. 5 is a graph indicating a simulation result of the gain characteristic of the power amplifier circuit according to the first embodiment of the present disclosure and the comparative example.

FIG. 5 is a graph indicating a simulation result of the gain characteristic of the power amplifier circuit according to the first embodiment of the present disclosure and the comparative example. In the graph presented in FIG. 5, the horizontal axis indicates the output power Pout (dBm) of transmit signal and the vertical axis indicates gain (dB).

As illustrated in FIG. 5, in comparison to the comparative example, although overall gain in the present embodiment slightly falls, the range in which gain remains at a certain level while the output power Pout increases is extended. Accordingly, the present embodiment is improved with respect to linearity as compared to the comparative example. Moreover, gain in the comparative example sharply falls after the output power exceeds approximately 30 dBm, whereas gain in the present embodiment only gradually falls after the output power exceeds approximately 30 dBm. This indicates that deterioration of linearity is hindered by reducing the effect of intermodulation distortion as presented in FIGS. 4A and 4B.

Figure 6:
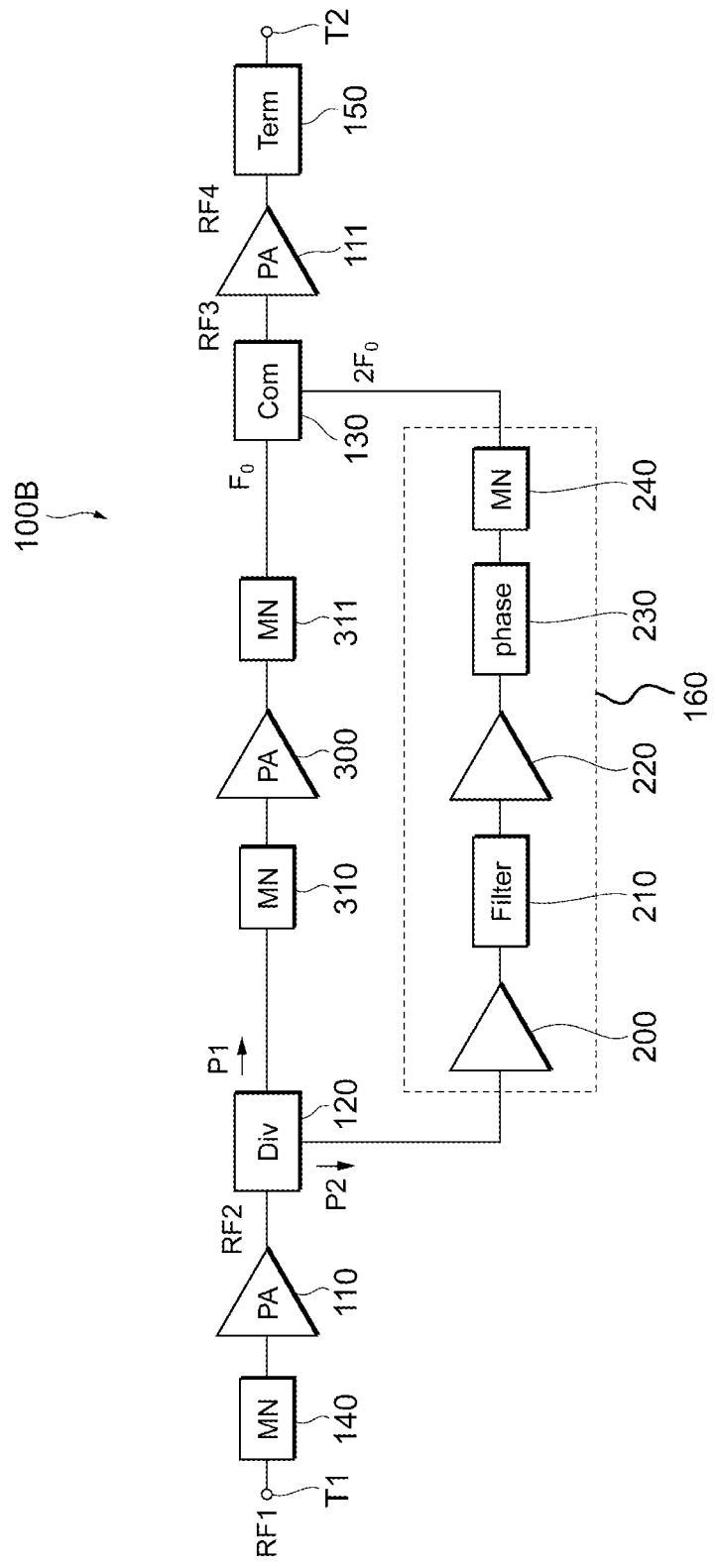
FIG. 6 is a diagram illustrating a configuration example of a power amplifier circuit according to a second embodiment of the present disclosure.

FIG. 6 is a diagram illustrating a configuration example of a power amplifier circuit according to a second embodiment of the present disclosure. In the present embodiment, descriptions about specifics common to those of the first embodiment are not repeated and only different points are explained. In particular, almost identical effects and advantages achieved by almost identical configurations are not mentioned in every embodiment.

A power amplifier circuit 100B illustrated in FIG. 6 includes an amplifier 300 and matching circuits 310 and 311 instead of the matching circuit 141 as compared to the power amplifier circuit 100A illustrated in FIG. 1.

The amplifier 300 (a fourth amplifier) is provided between the power divider 120 and the power combiner 130 on the primary path P1 and configured to amplify and output the RF signal RF2 (the input signal) having been divided by the power divider 120. The amplifier 300 is designed to amplify the frequency range of the fundamental wave $F_0$. This enables attenuation of harmonic waves including the second-harmonic wave caused by amplification of the amplifier 110 of the first stage. This means that the amplifier 300 is configured as a specific example of a second-harmonic-wave attenuation circuit.

The matching circuits 310 and 311 perform impedance matching respectively for the amplifier of the anterior stage and the amplifier of the posterior stage.

As such, attenuation of the second-harmonic wave in the primary path P1 in the present embodiment can be achieved by the amplifier 300 instead of the matching circuit 141 illustrated in FIG. 1. Also with this configuration, similarly to the power amplifier circuit 100A, the power amplifier circuit 100B can increase output power and also reduce the effect of intermodulation distortion. Furthermore, since the power amplifier circuit 100B includes the amplifiers 110, 300, and 111 in three stages, it is possible to further increase output power of transmit signal in comparison to the power amplifier circuit 100A.

Figure 7:
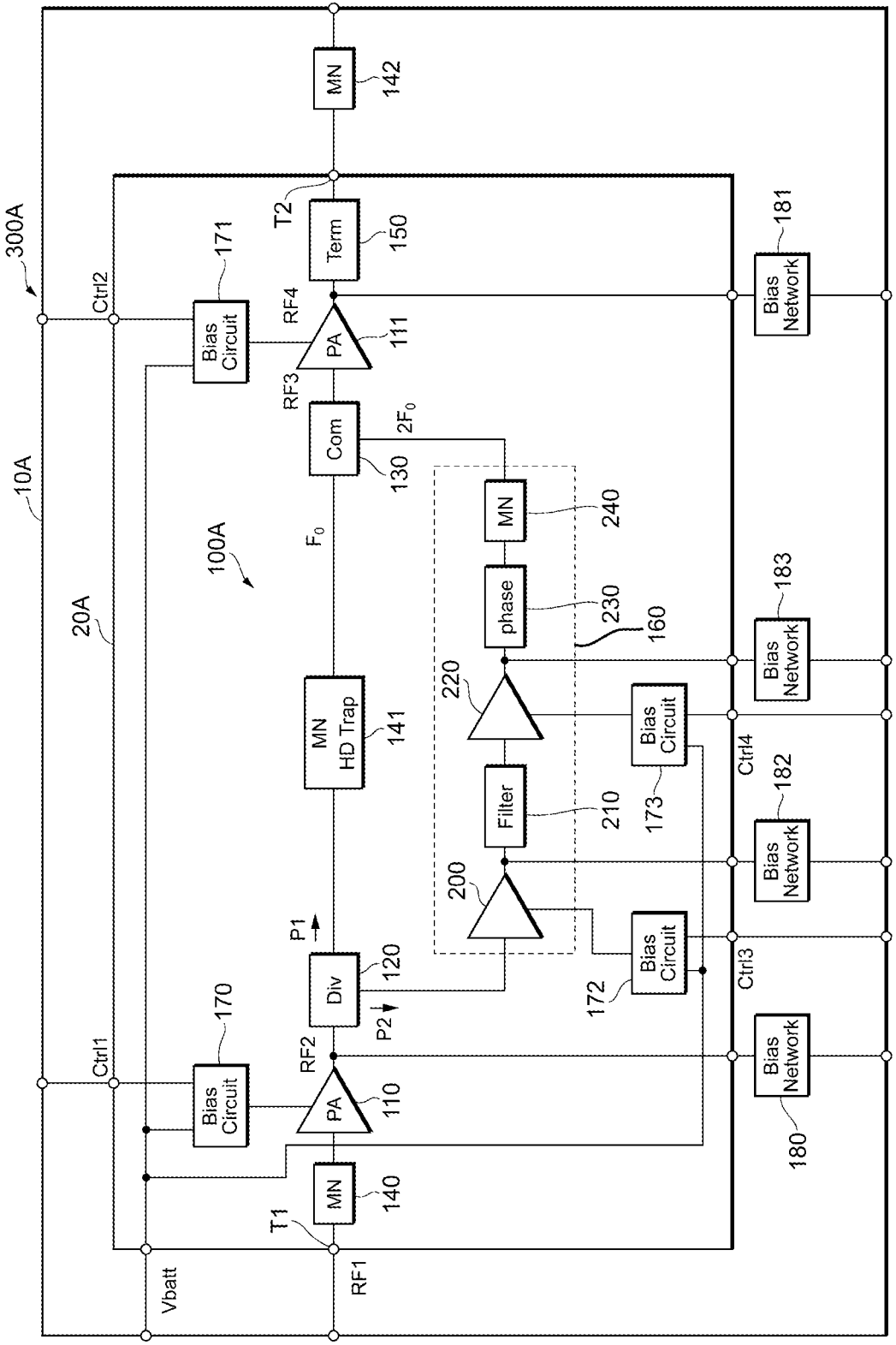
FIG. 7 is a diagram illustrating a configuration example of a transmit module including the power amplifier circuit according to the first embodiment of the present disclosure.

FIG. 7 is a diagram illustrating a configuration example of a transmit module including the power amplifier circuit according to the first embodiment of the present disclosure.

As illustrated in the drawing, a transmit module 300A includes a semiconductor chip 20A, a matching circuit 142, and bias networks 180 to 183, which are provided at a module substrate 10A. At the semiconductor chip 20A, the power amplifier circuit 100A according to the first embodiment and bias circuits 170 to 173 are provided in an integrated manner.

The matching circuit 142 performs impedance matching between the power amplifier circuit 100A provided in an anterior stage and another circuit (not illustrated in the drawing) provided in a posterior stage after the power amplifier circuit 100A. The matching circuit 142 may be formed inside the semiconductor chip 20A.

The bias networks 180 to 183 supply a power supply voltage respectively to the amplifiers 110 and 111, the harmonic-wave generation circuit 200, and the amplifier 220. A battery voltage Vbatt is supplied to the bias circuits 170 to 173 and the bias circuits 170 to 173 in turn supply a bias current or a bias voltage respectively to the amplifiers 110 and 111, the harmonic-wave generation circuit 200, and the amplifier 220 in accordance with control signals Ctrl1 to Ctrl4 inputted from outside of the module substrate 10A.

As described above, since the power amplifier circuit 100A including the distortion compensation circuit 160 and the bias circuits 170 to 173 are provided at the same semiconductor chip 20A in an integrated manner, it is possible to downsize the transmit module in comparison to, for example, a configuration in which the distortion compensation circuit 160 is formed outside the semiconductor chip 20A.

Figure 8:
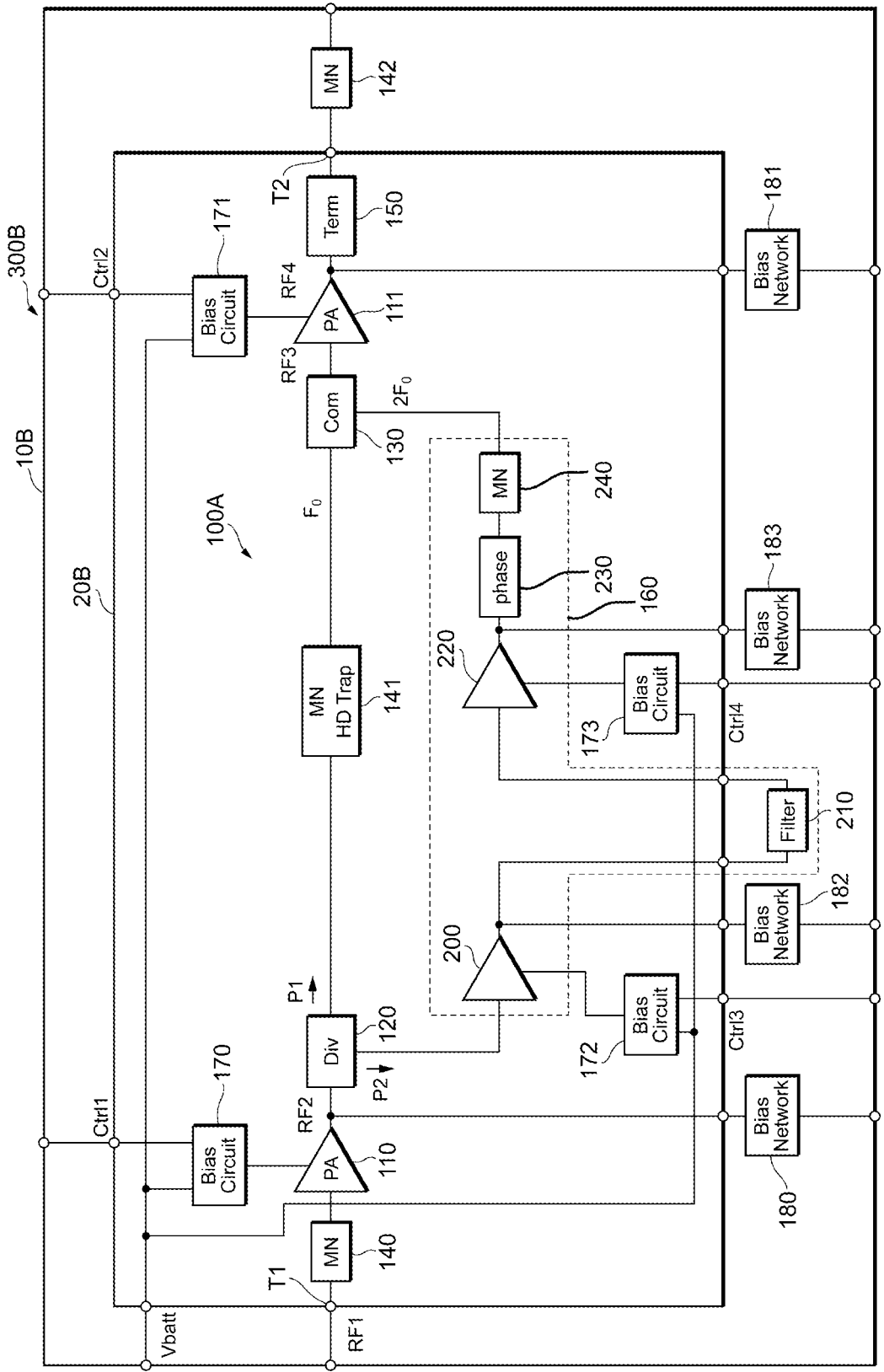
FIG. 8 is a diagram illustrating another configuration example of a transmit module including the power amplifier circuit according to the first embodiment of the present disclosure.

FIG. 8 is a diagram illustrating another configuration example of a transmit module including the power amplifier circuit according to the first embodiment of the present disclosure.

As illustrated in the drawing, the transmit module 300B differs from the transmit module 300A in that the filter circuit 210 included in the distortion compensation circuit 160 is formed outside a semiconductor chip 20B. This means that, in this configuration example, a harmonic wave outputted from the harmonic-wave generation circuit 200 once moves out of the semiconductor chip 20B and returns again to the semiconductor chip 20B through the filter circuit 210.

With this configuration, in the case in which the filter circuit 210 is configured as, for example, a SAW filter, it is possible to reduce the cost in comparison to a configuration in which the filter circuit 210 is formed at the semiconductor chip 20B. In this case, the filter circuit 210 may be provided at, for example, a module substrate 10B by using a surface mount device (SMD).

Figure 9:
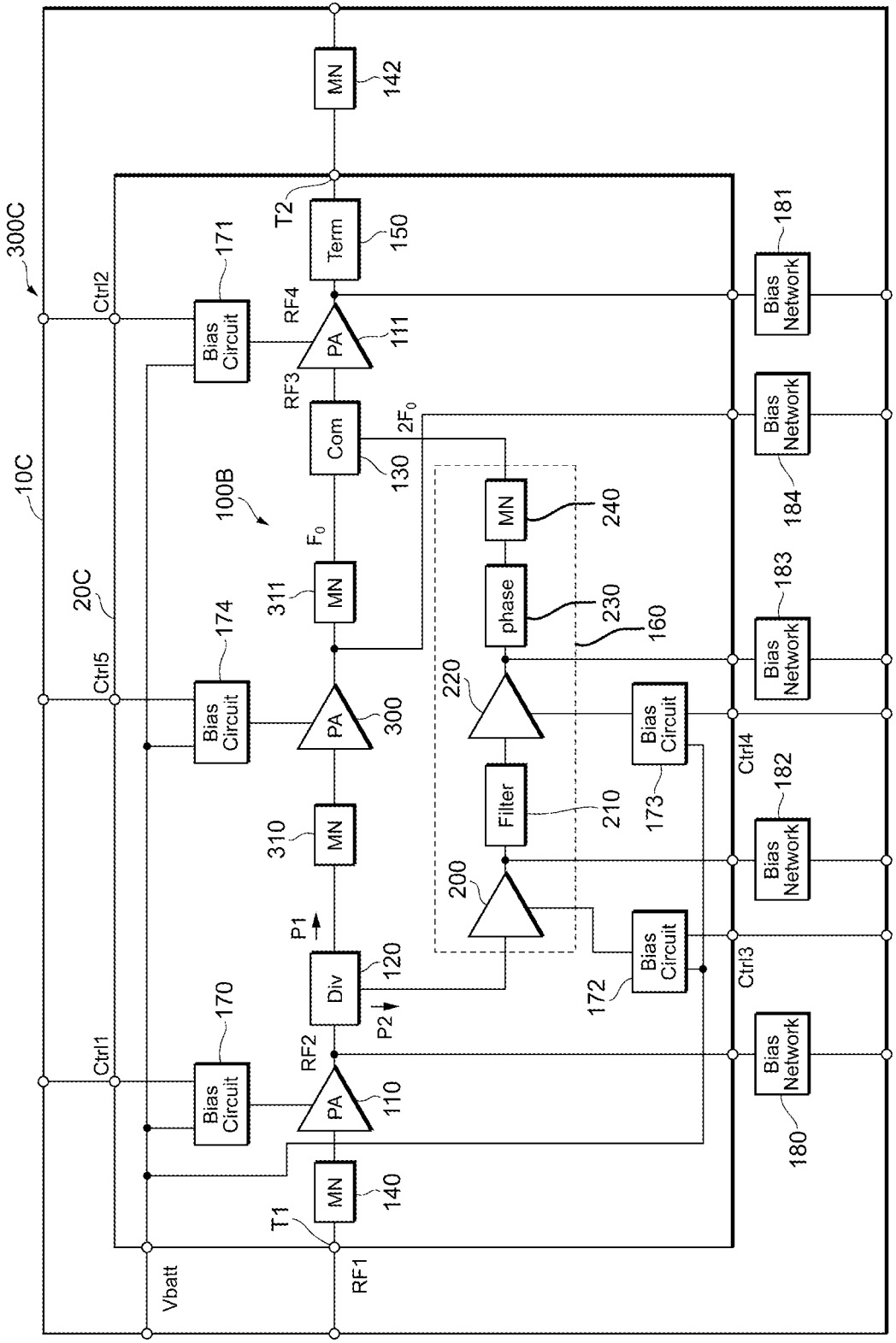
FIG. 9 is a diagram illustrating a configuration example of a transmit module including the power amplifier circuit according to the second embodiment of the present disclosure.

FIG. 9 is a diagram illustrating a configuration example of a transmit module including the power amplifier circuit according to the second embodiment of the present disclosure.

As illustrated in the drawing, a transmit module 300C differs from the transmit module 300A in that the semiconductor chip 20A is replaced with the semiconductor chip 20C and a bias network 184 is also included.

The semiconductor chip 20C includes the power amplifier circuit 100B according to the second embodiment and bias circuits 170 to 174. The battery voltage Vbatt is supplied to the bias circuit 174 and the bias circuit 174 in turn supplies a bias current or a bias voltage to the amplifier 300 in accordance with a control signal Ctrl5 inputted from outside of a module substrate 10C. The bias network 184 supplies a power supply voltage to the amplifier 300.

Also in this case, since the power amplifier circuit 100B including the distortion compensation circuit 160 and the bias circuits 170 to 174 are provided at the same semiconductor chip 20C in an integrated manner, it is possible to downsize the transmit module. Also in the transmit module 300C, similarly to the transmit module 300B, the filter circuit 210 may be formed outside the semiconductor chip 20C.

The transmit modules 300A to 300C described above may each constitute a high-frequency module in conjunction with a receive module including a low-noise amplifier (LNA). Furthermore, a plurality of any kind of the transmit modules 300A to 300C may constitute a multiband high-frequency module in conjunction with a plurality of receive modules. In this case, the plurality of modules respond respectively to signals at different frequency bands. The multiband high-frequency module may include modules respectively supporting a frequency division duplex (FDD) technique and a time division duplex (TDD) technique.

The exemplary embodiments of the present disclosure have been described above. The power amplifier circuits 100A and 100B include the power divider 120 configured to divide the RF signal RF2 and output the divided RF signal RF2 to the primary path P1 and the secondary path P2, the distortion compensation circuit 160 provided on the secondary path P2, the power combiner 130 configured to combine the fundamental wave $F_0$ of the RF signal RF2 having traveled along the primary path P1 with the second-harmonic wave $2F_0$ of the RF signal RF2 having traveled along the secondary path P2, and the amplifier 111 configured to amplify the RF signal RF3 outputted from the power combiner 130 and output the RF signal RF4. The distortion compensation circuit 160 includes the harmonic-wave generation circuit 200 configured to generate the second-harmonic wave $2F_0$ of the RF signal RF2, the filter circuit 210 configured to attenuate the fundamental wave $F_0$ and pass the second-harmonic wave $2F_0$, and the phase adjustment circuit 230 configured to adjust the phase of the second-harmonic wave $2F_0$. With this configuration, in comparison to the configuration in which the amplifier of the first stage amplifies the fundamental wave and also generates the second-harmonic wave, the power amplifier circuits 100A and 100B can generate a high-power second-harmonic wave. Therefore, it is possible to increase output power and also reduce the effect of intermodulation distortion.

Furthermore, the distortion compensation circuit 160 further includes the amplifier 220 configured to amplify the amplitude of the second-harmonic wave $2F_0$. The amplifier 220 is positioned between the harmonic-wave generation circuit 200 and the phase adjustment circuit 230. With this configuration, in comparison to the configuration without necessarily the amplifier 220 that amplifies the second-harmonic wave, the power amplifier circuits 100A and 100B can generate a higher-power second-harmonic wave. Therefore, it is possible to increase output power and also reduce the effect of intermodulation distortion.

Moreover, the amplifier 220 amplifies the amplitude of the second-harmonic wave $2F_0$ in such a manner that the signals obtained as the differences between the second-harmonic wave $2F_0$ and the fundamental wave $F_0$ and the third-order intermodulation distortions $IM3_L$ and $IM3_H$ occurring in the amplifier 111 cancel each other out at the output of the amplifier 111. With this configuration, when the level of output power of the transmit signal is relatively high, the power of the second-harmonic wave $2F_0$ can be also increased in accordance with the level.

Further, the phase adjustment circuit 230 changes the phase of the second-harmonic wave $2F_0$ in such a manner that the signals obtained as the differences between the second-harmonic wave $2F_0$ and the fundamental wave $F_0$ and the third-order intermodulation distortions $IM3_L$ and $IM3_H$ occurring in the amplifier 111 are substantially in antiphase at the output of the amplifier 111. With this configuration, the compensation signals $CS_L$ and $CS_H$ cancel out the third-order intermodulation distortions $IM3_L$ and $IM3_H$, and as a result, it is possible to reduce the effect of intermodulation distortion.

Furthermore, the power amplifier circuit 100A further includes the amplifier 110 provided in the stage before the power divider 120 and configured to output the RF signal RF2 and the matching circuit 141 provided between the power divider 120 and the power combiner 130 on the primary path P1 and configured to attenuate a signal in the frequency range of the second-harmonic wave $2F_0$. This configuration avoids the second-harmonic wave having traveled along the primary path P1 and the second-harmonic wave having traveled along the secondary path P2 cancelling each other out at the power combiner 130. As a result, in the power amplifier circuit 100A, a high-power second-harmonic wave can be inputted to the amplifier 111 in comparison to the configuration disclosed in Patent Document 1.

Moreover, the power amplifier circuit 100B further includes the amplifier 110 provided in a stage before the power divider 120 and configured to output the RF signal RF2 and the amplifier 300 configured to amplify the RF signal RF2 outputted to the primary path P1 by the power divider 120. This configuration avoids the second-harmonic wave having traveled along the primary path P1 and the second-harmonic wave having traveled along the secondary path P2 cancelling each other out at the power combiner 130. As a result, in the power amplifier circuit 100B, a high-power second-harmonic wave can be inputted to the amplifier 111 in comparison to the configuration disclosed in Patent Document 1. Additionally, since the power amplifier circuit 100B includes the amplifiers 110, 300, and 111 in three stages, it is possible to further increase output power of transmit signal in comparison to the power amplifier circuit 100A.

Further, in the transmit module 300B, the filter circuit 210 is formed outside the semiconductor chip 20B at which the amplifier 111 is formed. In the case in which the filter circuit 210 is configured as, for example, a SAW filter, it is possible to reduce the cost in comparison to a configuration in which the filter circuit 210 is formed at the semiconductor chip 20B.

The embodiments described above have been made for ease of understanding the present disclosure and should not be construed to limit the present disclosure. The present disclosure can be changed or improved without necessarily departing from its spirit and also includes equivalents thereof. This means that modifications to the embodiments designed by those skilled in the art as appropriate are also embodied in the scope of the present disclosure when the modifications have features of the present disclosure. For example, the elements included in the embodiments, the arrangements thereof, materials, conditions, shapes, sizes are not limited to the examples and may be changed as appropriate. Furthermore, the elements included in the embodiments can be combined with each other when technically possible and combinations thereof may be encompassed in the scope of the present disclosure when the combinations have features of the present disclosure.

REFERENCE SIGNS LIST 10A-10C . . . module substrate, 20A-20C . . . semiconductor chip, 100A, 100B . . . power amplifier circuit, 110, 111, 220, 300 . . . amplifier, 120 . . . power divider, 130 . . . power combiner, 140, 141, 142, 240, 310, 311 . . . matching circuit, 150 . . . harmonic termination circuit, 160 . . . distortion compensation circuit, 170-174 . . . bias circuit, 180-183 . . . bias network, 200 . . . harmonic-wave generation circuit, 210 . . filter circuit, 230 . phase adjustment circuit, 300A-300C . . . transmit module, T1 . . . input terminal, T2 . . . output terminal, P1 . . . primary path, P2 . . . secondary path

The invention claimed is:

1. A power amplifier circuit comprising:
   a power divider configured to divide an input signal, and to output the divided input signal to a primary path and a secondary path;
   a distortion compensation circuit in the secondary path;
   a power combiner configured to combine a fundamental wave of the input signal from the primary path with a second-harmonic wave of the input signal from the secondary path; and
   a first amplifier configured to amplify a combined signal outputted from the power combiner, and to output an amplified signal,
   wherein the distortion compensation circuit comprises:
      a generation circuit configured to generate the second-harmonic wave of the input signal,
      a filter circuit configured to attenuate the fundamental wave and to pass the second-harmonic wave, and
      a phase adjustment circuit configured to adjust a phase of the second-harmonic wave,
   wherein the distortion compensation circuit further comprises a second amplifier configured to amplify an amplitude of the second-harmonic wave, and
   wherein the second amplifier is between the generation circuit and the phase adjustment circuit.

2. The power amplifier circuit according to claim 1, wherein the second amplifier is configured to amplify the amplitude of the second-harmonic wave such that a signal obtained as a difference between the second-harmonic wave and the fundamental wave cancels, at an output of the first amplifier, a third-order intermodulation distortion occurring in the first amplifier.

3. The power amplifier circuit according to claim 1, wherein the phase adjustment circuit is configured to change the phase of the second-harmonic wave such that a signal obtained as a difference between the second-harmonic wave and the fundamental wave is substantially antiphase with, at an output of the first amplifier, a third-order intermodulation distortion occurring in the first amplifier.

4. The power amplifier circuit according to claim 2, wherein the phase adjustment circuit is configured to change the phase of the second-harmonic wave such that the signal obtained as the difference between the second-harmonic wave and the fundamental wave is substantially antiphase with, at the output of the first amplifier, the third-order intermodulation distortion occurring in the first amplifier.

5. The power amplifier circuit according to claim 1, further comprising:
   a third amplifier in a stage preceding the power divider, the third amplifier being configured to output the input signal; and
   a second-harmonic-wave attenuation circuit between the power divider and the power combiner in the primary path, the second harmonic-wave attenuation circuit being configured to attenuate a signal in a frequency range of the second-harmonic wave.

6. The power amplifier circuit according to claim 3, further comprising:
a third amplifier in a stage preceding the power divider, the third amplifier being configured to output the input signal; and
a second-harmonic-wave attenuation circuit between the power divider and the power combiner in the primary path, the second harmonic-wave attenuation circuit being configured to attenuate a signal in a frequency range of the second-harmonic wave.

7. The power amplifier circuit according to claim 5, wherein the second-harmonic-wave attenuation circuit comprises a fourth amplifier configured to amplify the input signal outputted to the primary path by the power divider.

8. The power amplifier circuit according to claim 1, wherein the filter circuit is arranged outside a semiconductor chip at which the first amplifier is arranged.

9. A power amplifier circuit comprising:
a power divider configured to divide an input signal, and to output the divided input signal to a primary path and a secondary path;
a distortion compensation circuit in the secondary path;
a power combiner configured to combine a fundamental wave of the input signal from the primary path with a second-harmonic wave of the input signal from the secondary path; and
a first amplifier configured to amplify a combined signal outputted from the power combiner, and to output an amplified signal;
a third amplifier in a stage preceding the power divider, the third amplifier being configured to output the input signal; and
a second-harmonic-wave attenuation circuit between the power divider and the power combiner in the primary path, the second harmonic-wave attenuation circuit being configured to attenuate a signal in a frequency range of the second-harmonic wave,
wherein the distortion compensation circuit comprises:
a generation circuit configured to generate the second-harmonic wave of the input signal,
a filter circuit configured to attenuate the fundamental wave and to pass the second-harmonic wave, and
a phase adjustment circuit configured to adjust a phase of the second-harmonic wave.

10. The power amplifier circuit according to claim 9, wherein the phase adjustment circuit is configured to change the phase of the second-harmonic wave such that a signal obtained as a difference between the second-harmonic wave and the fundamental wave is substantially antiphase with, at an output of the first amplifier, a third-order intermodulation distortion occurring in the first amplifier.

11. The power amplifier circuit according to claim 9, wherein the second-harmonic-wave attenuation circuit comprises a fourth amplifier configured to amplify the input signal outputted to the primary path by the power divider.

* * * * *